United States Patent
McKittrick et al.

(10) Patent No.: US 10,698,445 B1
(45) Date of Patent: Jun. 30, 2020

(54) INFORMATION HANDLING SYSTEM MULTI-CELL CANTILEVERED BATTERY

(71) Applicant: Dell Products L.P., Round Rock, TX (US)

(72) Inventors: Allen B. McKittrick, Cedar Park, TX (US); Ernesto Ramirez, Austin, TX (US); Jeffrey D. Kane, Austin, TX (US); Richard Christopher Thompson, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/220,696

(22) Filed: Dec. 14, 2018

(51) Int. Cl.
*G06F 1/16* (2006.01)
*H01M 10/04* (2006.01)
*H05K 7/20* (2006.01)
*H02J 50/12* (2016.01)
*H02J 7/04* (2006.01)
*H01M 10/42* (2006.01)

(52) U.S. Cl.
CPC .......... *G06F 1/1635* (2013.01); *G06F 1/1618* (2013.01); *G06F 1/1681* (2013.01); *H01M 10/0436* (2013.01); *H01M 10/425* (2013.01); *H02J 7/04* (2013.01); *H02J 50/12* (2016.02); *H05K 7/20* (2013.01); *H01M 2010/4271* (2013.01)

(58) Field of Classification Search
CPC .......... H01M 10/0436; H01M 2/1022; H01M 2/204; G06F 1/1616; G06F 1/1635; G06F 1/203; H05K 7/20
See application file for complete search history.

(56) References Cited

U.S. PATENT DOCUMENTS

| 5,212,024 | A | * | 5/1993 | Klink | H01M 2/1077 429/120 |
| 5,389,460 | A | | 2/1995 | Oswald et al. | |
| 5,569,520 | A | * | 10/1996 | Bates | H01M 4/0447 429/162 |
| 6,188,573 | B1 | * | 2/2001 | Urita | G06F 1/1616 165/80.3 |
| 6,224,995 | B1 | * | 5/2001 | Fauteux | H01M 4/0442 29/623.1 |
| 6,380,930 | B1 | | 4/2002 | Van Ruymbeke | |
| 6,551,740 | B1 | * | 4/2003 | Melichar | H01M 10/643 429/120 |
| 6,765,536 | B2 | | 7/2004 | Phillips et al. | |

(Continued)

OTHER PUBLICATIONS

Semtech, "Semtech SX9306 Ultra Low Power SAR Proximity Sensor," downloaded from https://www.mouser.com/new/semtech/semtech-sx9306-sar-sensor/ on Dec. 13, 2018, 2 pages.

(Continued)

*Primary Examiner* — Adrian S Wilson
(74) *Attorney, Agent, or Firm* — Zagorin Cave LLP; Robert W. Holland

(57) ABSTRACT

A portable information handling system battery pack couples plural flat battery cells to a frame in first and second planes having battery cells of the first plane aligned to extend past battery cells of the second plane in a cantilevered manner. In one embodiment, the battery pack integrates a battery management unit and a wireless charger.

20 Claims, 8 Drawing Sheets

(56) References Cited

U.S. PATENT DOCUMENTS

| | | | | |
|---|---|---|---|---|
| 6,768,637 | B1* | 7/2004 | Amemiya | G06F 1/1632 |
| | | | | 361/679.27 |
| 9,537,186 | B2* | 1/2017 | Chung | H01M 10/647 |
| 2001/0015885 | A1* | 8/2001 | Nakajima | G06F 1/187 |
| | | | | 361/679.08 |
| 2003/0211868 | A1* | 11/2003 | Wu | H04M 1/0214 |
| | | | | 455/572 |
| 2004/0185336 | A1* | 9/2004 | Ito | H01M 4/667 |
| | | | | 429/152 |
| 2007/0008691 | A1* | 1/2007 | Kim | G06F 1/1616 |
| | | | | 361/679.33 |
| 2007/0172726 | A1 | 7/2007 | Miller et al. | |
| 2008/0062065 | A1 | 3/2008 | Yamamoto et al. | |
| 2010/0112833 | A1 | 5/2010 | Jeon | |
| 2010/0310916 | A1 | 12/2010 | Coish et al. | |
| 2011/0183183 | A1* | 7/2011 | Grady | H01M 2/1022 |
| | | | | 429/152 |
| 2012/0015236 | A1* | 1/2012 | Spare | H01M 2/0275 |
| | | | | 429/162 |
| 2012/0298441 | A1 | 11/2012 | Lin et al. | |
| 2013/0236768 | A1 | 9/2013 | Park et al. | |
| 2015/0035709 | A1 | 2/2015 | Lim | |
| 2015/0169007 | A1* | 6/2015 | Matsuoka | B29C 45/44 |
| | | | | 361/679.09 |
| 2015/0200418 | A1 | 7/2015 | Grady et al. | |
| 2018/0337372 | A1* | 11/2018 | Rivera | H01M 10/0525 |

OTHER PUBLICATIONS

Toit, R., "Using proximity sensing to meet mobile device FCC SAR regulations," Apr. 17, 2012, downloaded from https://www.embedded.com/design/connectivity/4371201/1/Using-proximity-sensing-to-meet-mobile-device-FCC-SAR-regulations, 4 pages.

International Search Report and Written Opinion from International Application No. PCT/US2019/064509, filed Dec. 4, 2019, 12 pages.

* cited by examiner

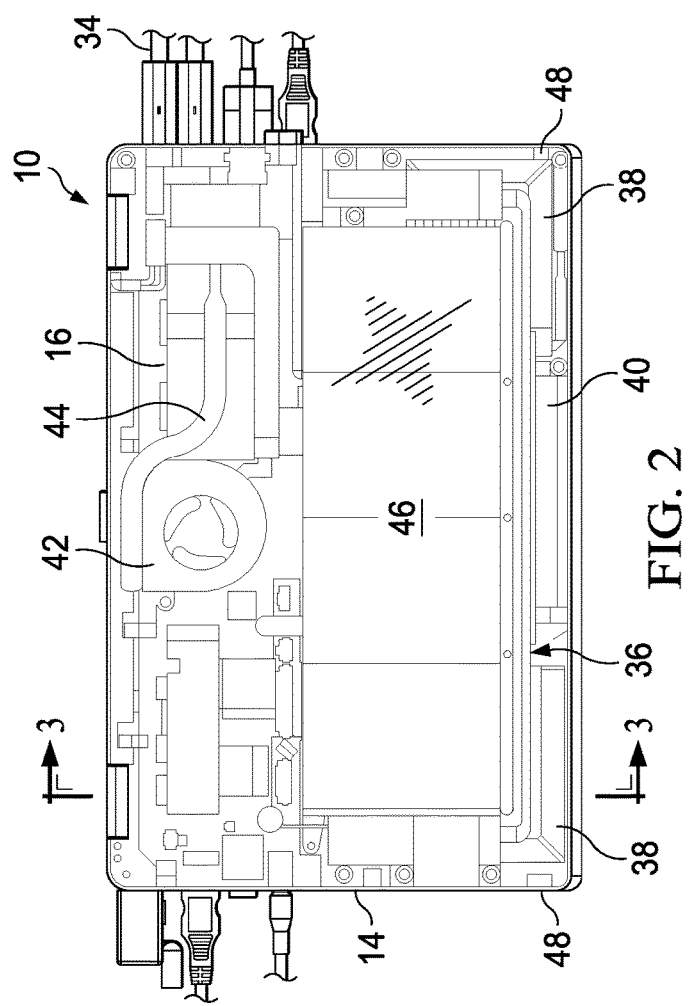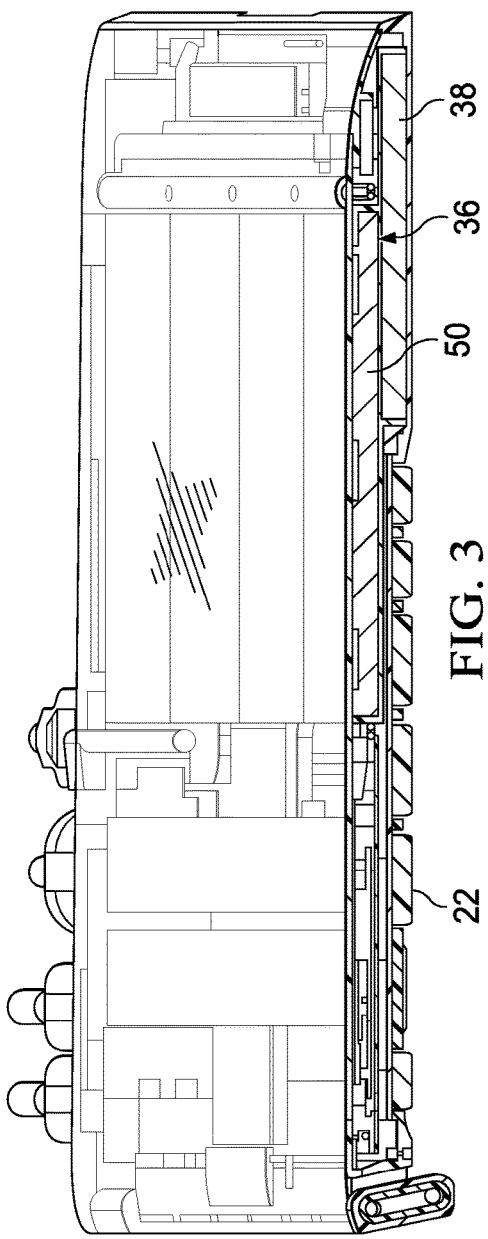

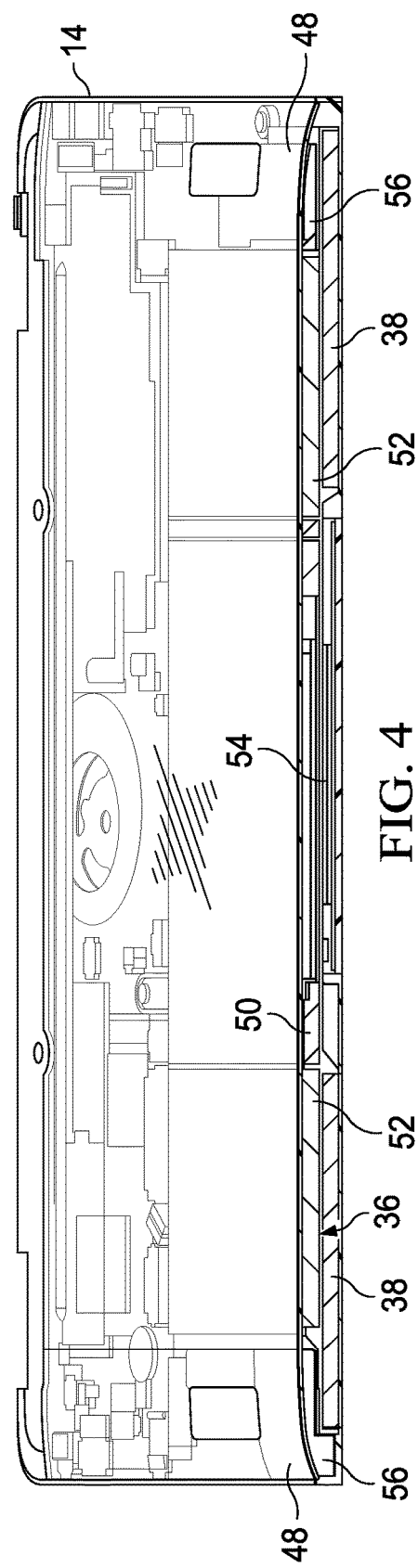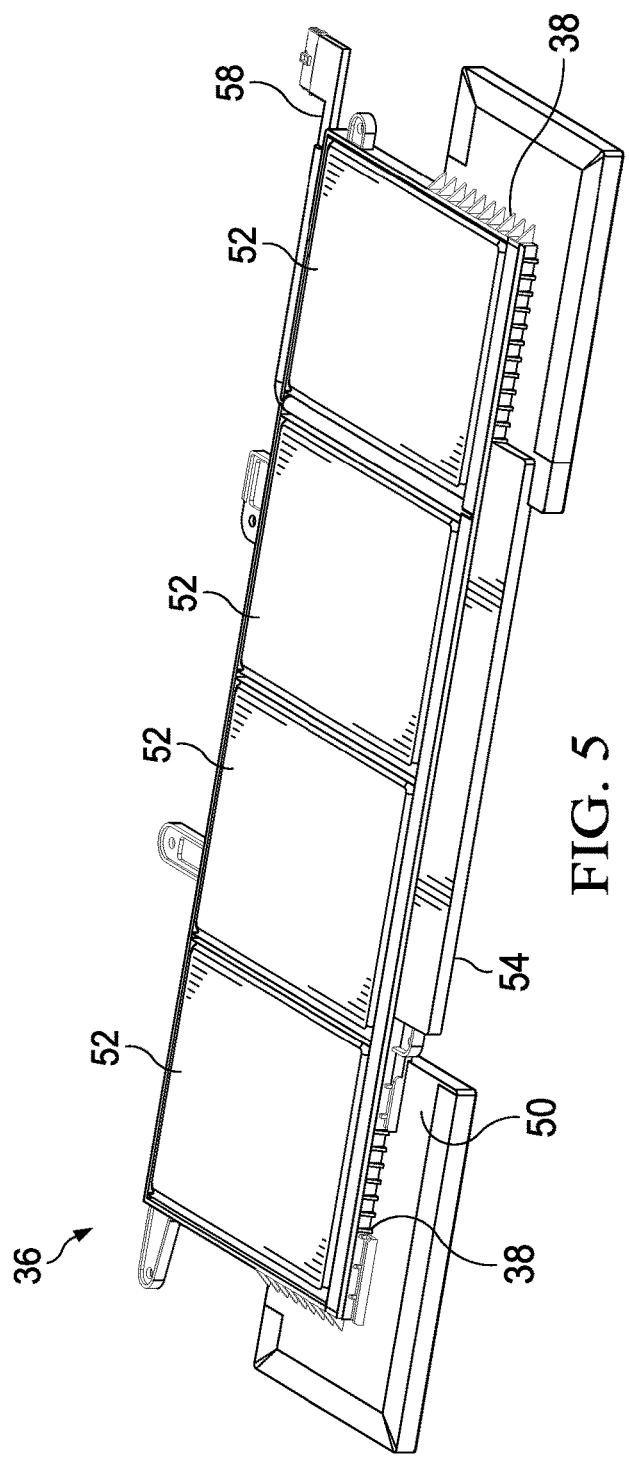

INFORMATION HANDLING SYSTEM MULTI-CELL CANTILEVERED BATTERY

BACKGROUND OF THE INVENTION

Field of the Invention

The present invention relates in general to the field of information handling system integrated power sources, and more particularly to an information handling system multi-cell cantilevered battery.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems typically integrate processing components, input/output (I/O) devices and a power source in a portable housing to support mobile end user operations without hardwired connections to external power and peripherals. For example, portable information handling systems often integrate a touchscreen display at one side that acts as both a display to present information and an input device, such as by presenting a virtual keyboard that accepts touches as keyed inputs. Tablet information handling systems typically have a single planar housing with the display disposed on one side and covering the processing components. Convertible information handling systems typically have the display integrated in a lid housing portion that rotationally couples to a main housing portion containing the processing components under a keyboard. Convertible information handling systems rotate the lid housing portion relative to the main housing portion from a closed position that enhances portability to an open position that exposes the keyboard and display for end user interactions. Some convertible information handling systems rotate the housing portions 360 degrees to expose the display in a tablet mode. In some cases, the lid housing portion includes the processing components and separates from the main housing portion to act as a separate tablet device.

End users generally prefer portable information handling systems that have minimal weight for a given display size, however, reducing system weight typically results in reduced processing capabilities. To reduce weight for a given display size, system height is typically decreased, which decreases the amount of room for processing components and an integrated power source in the housing. Low Z-height housings generally have less room to support active thermal transfer, such as by a cooling fan, so that processing components selected for the housing tend to have lower power dissipation. For instance, low Z-height systems tend to include less powerful central processing units (CPUs) to avoid excess thermal energy release and smaller battery packs with shorter charge life. In addition, component placement tends to face restrictions so that dissipated thermal energy is not concentrated within the housing. Other component placement restrictions further complicate low Z-height systems, such as placement of antenna to achieve sufficient wireless signal communication and placement of speakers to provide adequate sound quality. Compromises in component selection and placement to achieve low Z-height tend to impact the end user's experience with the information handling system.

Conventional portable information handling systems have used battery packs as an internal power source built from lithium ion 18650 battery cells connected in parallel and series to achieve desired internal direct current voltages. A typical lithium ion battery cell has a native voltage of around 3.7 VDC so that four cells in series will provide a native voltage of around 14.1 VDC and five cells in series will provide around 17.8 VDC. A common conventional lithium ion battery pack might have eight battery cells with two sets of four battery cells in series. To reduce the vertical height of a battery pack, information handling systems have migrated from 18650 battery cells to flat battery cells with at least some of the flat battery cells stacked vertically. Vertical stacking of flat battery cells tends to offer greater footprint efficiency than battery packs built from round 18650 cells, thus supporting lower Z-height housing designs. However, during discharge and charge, battery cells release thermal energy that adds to the thermal dissipation difficulty associated with poor airflow within low Z-height housings.

SUMMARY OF THE INVENTION

Therefore, a need has arisen for a system and method which allocates flat battery cells in a portable information handling system to provide improved thermal dissipation and housing space allocation.

In accordance with the present invention, a system and method are provided which substantially reduce the disadvantages and problems associated with previous methods and systems for integrating battery cells into a battery pack that powers a portable information handling system. Flat battery cells of a battery pack couple to a frame in first and second planes with the flat battery cells of the second plane offset relative to the flat battery cells of the first plane in a cantilevered disposition that improves thermal dissipation and component placement in an information handling system portable housing.

More specifically, a portable information handling system processes information with processing components disposed in a portable housing and powered by a battery pack. The battery pack has plural flat lithium ion battery cells coupled to a frame in two separate planes. The upper surface of the frame couples a row of battery cells disposed end to end and interfaced with a battery management unit that manages battery pack charge and discharge. The lower surface of the frame couples to battery cells in a cantilevered disposition relative to the row of battery cells on the upper surface of the frame. For instance, at each end of the row of battery cells, a battery cell of the lower surface extends a corner out from the row so that first and second sides of the battery cell on each end are misaligned relative to the row of battery cells. In one example embodiment, all of the battery cells have the same rectangular dimensions and the battery cells of the lower surface couple in an orientation perpendicular to the orientation of the battery cells in the row of the upper surface. In another example embodiment, a wireless charging device is integrated in the battery pack.

The present invention provides a number of important technical advantages. One example of an important technical advantage is that a portable information handling system battery pack integrates in a low Z-height housing with improved thermal dissipation. Cantilevered stacking of the battery cells reduces the temperature delta between battery cells that are vertically stacked by reducing battery cell surface contact to offer increased charge life in a reduced product size. Open regions defined by the battery pack provide room to support accessories like antenna and space to improve speaker acoustics. In one example embodiment, wireless charging integrates with the battery pack to provide a compact and efficient wireless charging capability in a low Z-height housing.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 2 depicts a lower cutaway view of an information handling system having a battery pack with battery cells disposed in a cantilevered configuration;

FIG. 3 depicts a side cross sectional view of disposition of the battery pack in the main housing portion of information handling system;

FIG. 4 depicts a front cross sectional view of disposition of battery cells in battery pack 36 of information handling system;

FIG. 5 depicts an upper perspective view of the battery pack separate from the information handling system;

DETAILED DESCRIPTION

A portable information handling system battery pack disposes battery cells in first and second planes with battery cells of plane coupled in a cantilever fashion relative to battery cells of the other plane. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
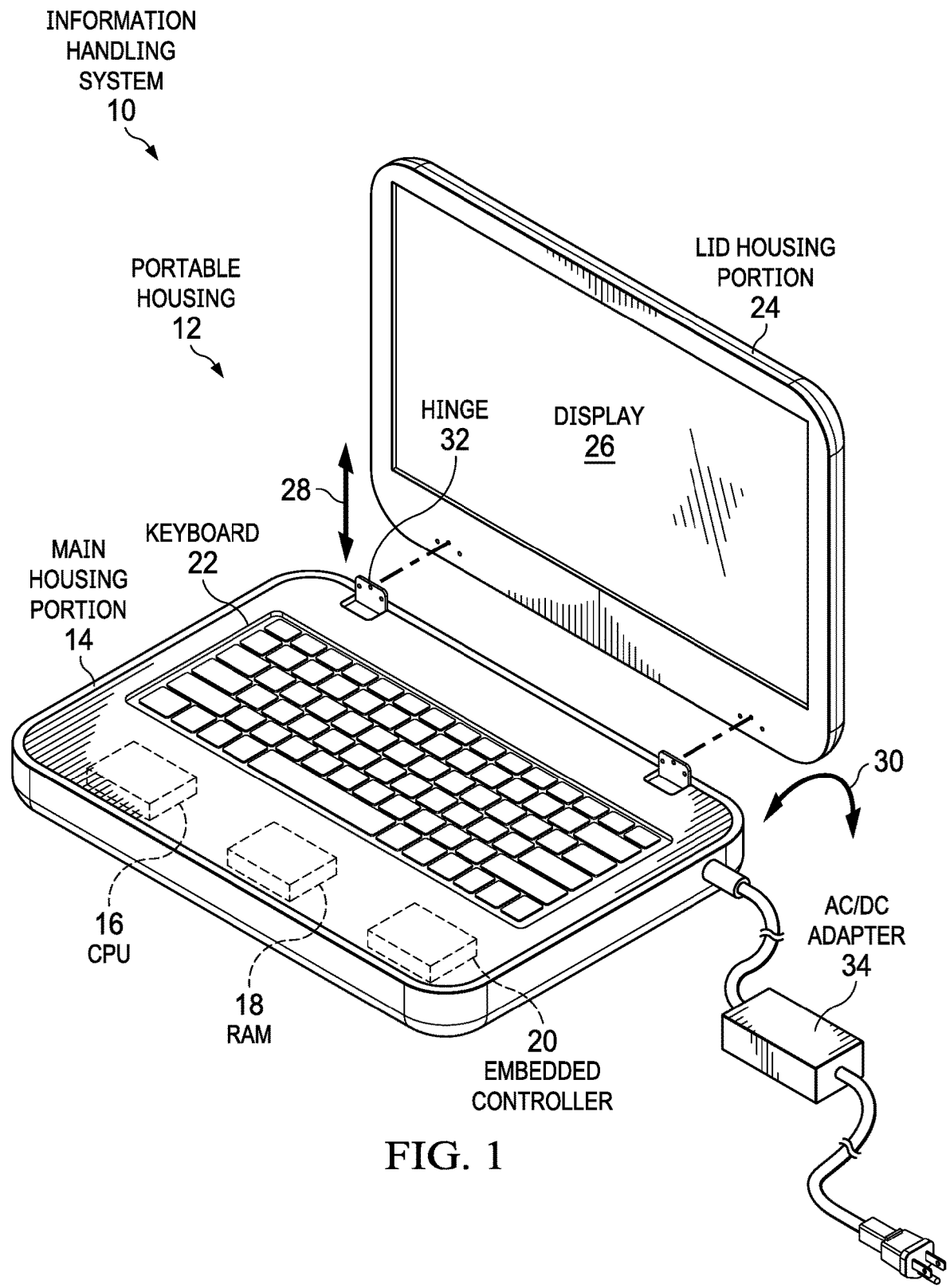
FIG. 1 depicts an upper perspective view of example embodiment of a portable information handling system powered by an integrated battery pack.

Referring now to FIG. 1, an upper perspective view depicts a portable information handling system 10 powered by an integrated battery pack. In the example embodiment, information handling system 10 integrates processing components in a portable housing 12 that supports convertible configurations. A main housing portion 14 contains processing components that process information, such as central processing unit (CPU) 16 and random access memory (RAM) 18 that cooperate to execute instructions that process information. An embedded controller 20 manages power for the processing components and interactions with input/output (I/O) devices, such as a keyboard 22 integrated in the upper surface of main housing portion 14. A lid housing portion 24 integrates a display 26 that interfaces with processing components main housing portion 14 to present information as visual images. In the example embodiment, hinges 32 rotationally couple main housing portion 14 and lid housing portion to rotate between open and closed positions as depicted by arrow 30. In an alternative embodiment, lid housing portion 24 may include processing components that operate separately from main housing portion 14 to support removal of lid housing portion 24 as indicated by arrow 28 to operate as a standalone tablet. An external power source AC/DC adapter 34 provides external power that operates the processing components and charges an integrated battery that supports mobile operation without external power. In operation, an end user rotates display 26 to a vertical position over keyboard 22, typically referred to as a clamshell position, so that an end user may type inputs at keyboard 22 while viewing display 26. In one embodiment, lid housing portion 24 rotates 360 degrees relative to main housing portion 14 to operate in a tablet position, such as by using a touchscreen of display 26 as the I/O device. Alternatively, lid housing portion 24 separates from main housing portion 14 to act as tablet. In such an embodiment, lid housing portion 24 integrates processing components and a battery to support mobile use.

Referring now to FIG. 2, a lower cutaway view depicts an information handling system 10 having a battery pack 36 with battery cells 38 disposed in a cantilevered configuration. As illustrated by FIG. 2, disposition of processing components in main housing portion 14 has tight constraints that limit thermal dissipation of excess thermal energy created by the processing components. In the example embodiment, a cooling fan 42 generates a cooling airflow to remove thermal energy, such as is generated by a CPU 16 coupled to a heat sink 44. Although CPU 16 presents the greatest thermal energy source, other processing components integrated in main housing portion 14 generate thermal energy that contributes to the system's internal thermal state. For example, external power provided by an adapter 34 is converted to operational voltages and used to charge battery pack 36, thus generating thermal energy. Larger components, such as solid state drive 46, fill the housing space to reduce airflow that transports excess thermal energy under the influence of cooling fan 42. Battery pack 36 has an elongated and flat form that is not readily accessible by cooling airflow. In addition, battery pack 38 is coupled to main housing portion 14 in a region that includes accessories that typically need access at the outside of housing 12, such as wireless local area network (WLAN) antenna 40 disposed between cantilevered battery cells 38 and speakers 48.

Referring now to FIG. 3, a side cross sectional view depicts disposition of battery pack 36 in main housing portion 14 of information handling system 10. The cross-sectional location is indicated by lines A-A of FIG. 2. Battery pack 36 has battery cells disposed in two separate planes with cantilevered battery cells 38 disposed in a plane located against the top surface of main housing portion 14 and with a battery frame 50 holding a set of flat battery cells in another plane below keyboard 22. Battery frame 50 and the battery cells in the lower plane help to support keyboard 22, which abuts against cantilevered battery cells 38. The offset of the cantilevered battery cells 38 relative to the battery cells in the lower plane of battery frame 50 provides improved thermal dissipation from battery pack 36 and avoids concentrations of thermal energy that can occur with direct vertical stacking of battery cells of a battery pack.

Referring now to FIG. 4, a front cross sectional view depicts disposition of battery cells in battery pack 36 of information handling system 10. Cantilevered battery cells 38 extend further towards the sides of main housing portion 14 than do battery cells 52, which are disposed in the lower plane of battery back 36. A battery management unit (BMU) 54 is assembled into frame 50 at a central location to manage charge and discharge of battery pack 36. In the example embodiments, space created at the ends of cantilevered battery cells 38 defines an acoustic chamber 56 that aids in presentation of audible sounds by speakers 48. As is evident from the side and front cross sectional views, a corner portion of each cantilevered battery cell 38 in the plane of battery frame 50 closest to the upper surface of main housing portion 14 does not overlap with the battery cells 52 in the lower plane of battery frame 50.

Referring now to FIG. 5, an upper perspective view depicts battery pack 36 separate from information handling system 10. In the example embodiment, a first set of four flat battery cells 52 are coupled to battery frame 50 end to end to form a row in an upper plane of battery frame 50. For example, battery cells 52 interface with BMU 54 in parallel or series connections to provide a desired direct current output voltage at connector 58. Two cantilevered battery cells 38 couple at each end of battery frame 50 to extend a corner portion out from the row defined by battery cells 52. Between cantilevered battery cells 38 a BMU 54 couples to frame 50 to interface cantilevered battery cells 38 with the battery cells 52 as desired to achieve a desired output voltage at connector 58. In the example embodiment, all of battery cells 52 and 38 are substantially identical in dimensions and electrical characteristics, such as having the same model number and manufacturer. To enhance thermal dissipation, cantilevered battery cells 38 are rotated ninety degrees relative to battery cells 52. For instance battery cells 52 have a rectangular shape with a short side of the rectangle parallel to the front of battery pack 36 while cantilevered battery cells 38 have the same rectangular shape with a short side of the rectangle perpendicular to the front of battery pack 36. Battery frame 50 supports cantilevered battery cells 38 with a metal structure that prevents hyper extension and damage to the cells. Although the example embodiment has six identical battery cells, alternative embodiments may use more or fewer battery cells and may include battery cells with different dimensions and shapes. For example, flat battery cells may be selected to have shapes that fit into desired spaces of a housing with each plane of battery pack 36 having battery cells of similar dimensions as desired to meet physical layout constraints within the housing.

Figure 6:
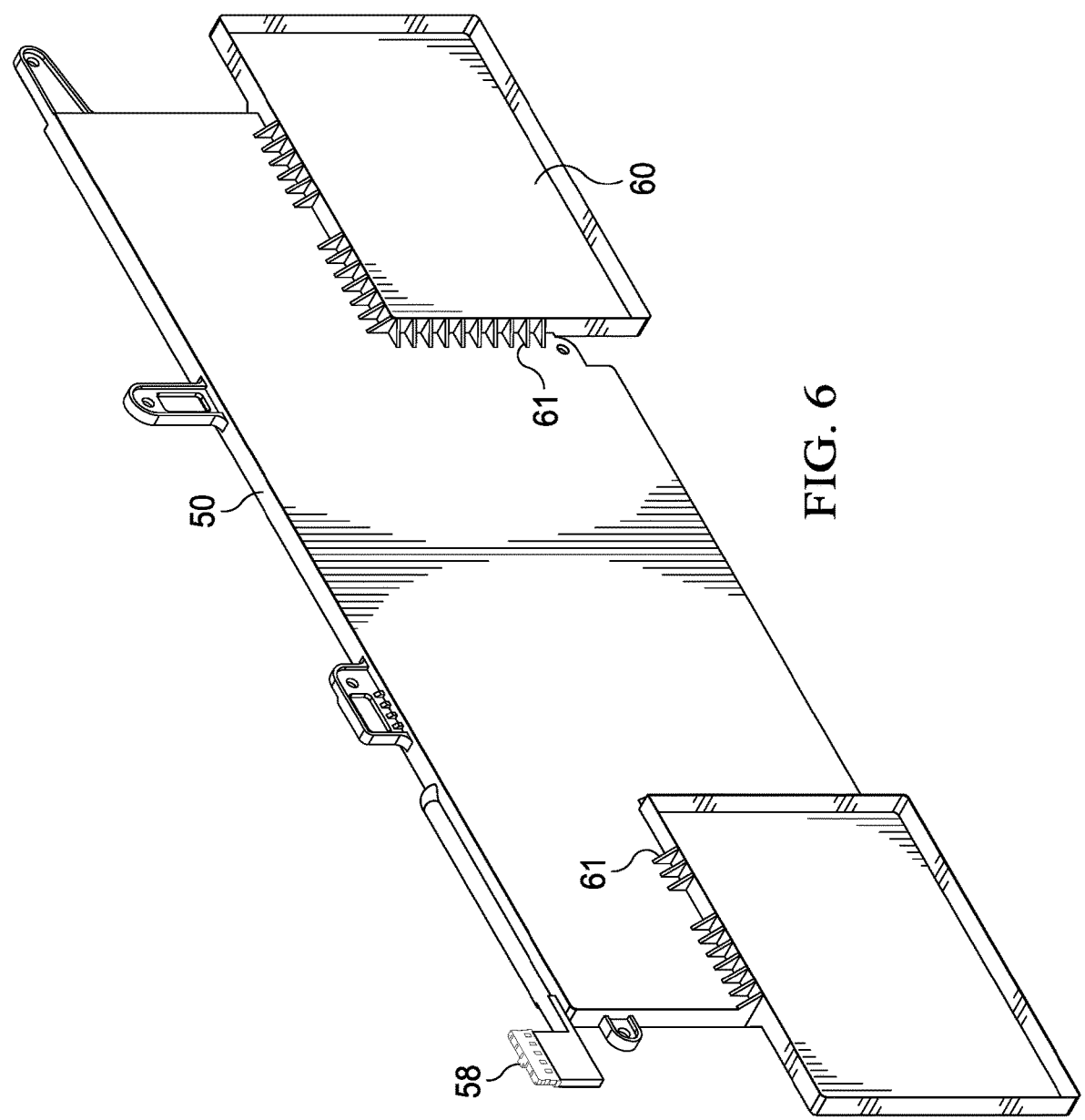
FIG. 6 depicts an upper side perspective view of the battery frame without battery cells installed.

Referring now to FIG. 6, an upper side perspective view depicts battery frame 50 without battery cells installed. Battery frame 50 is constructed of a light weight metal, such as aluminum, or plastic having sufficient rigidity to prevent undue stress to the battery cells. In particular, battery cavities 60 formed in the cantilever plane support the portions of cantilevered battery cells 38 that extend out from battery pack 36. Interconnects 61 formed in battery frame 50 define interfaces by the battery cells with BMU 54.

Figure 7A:
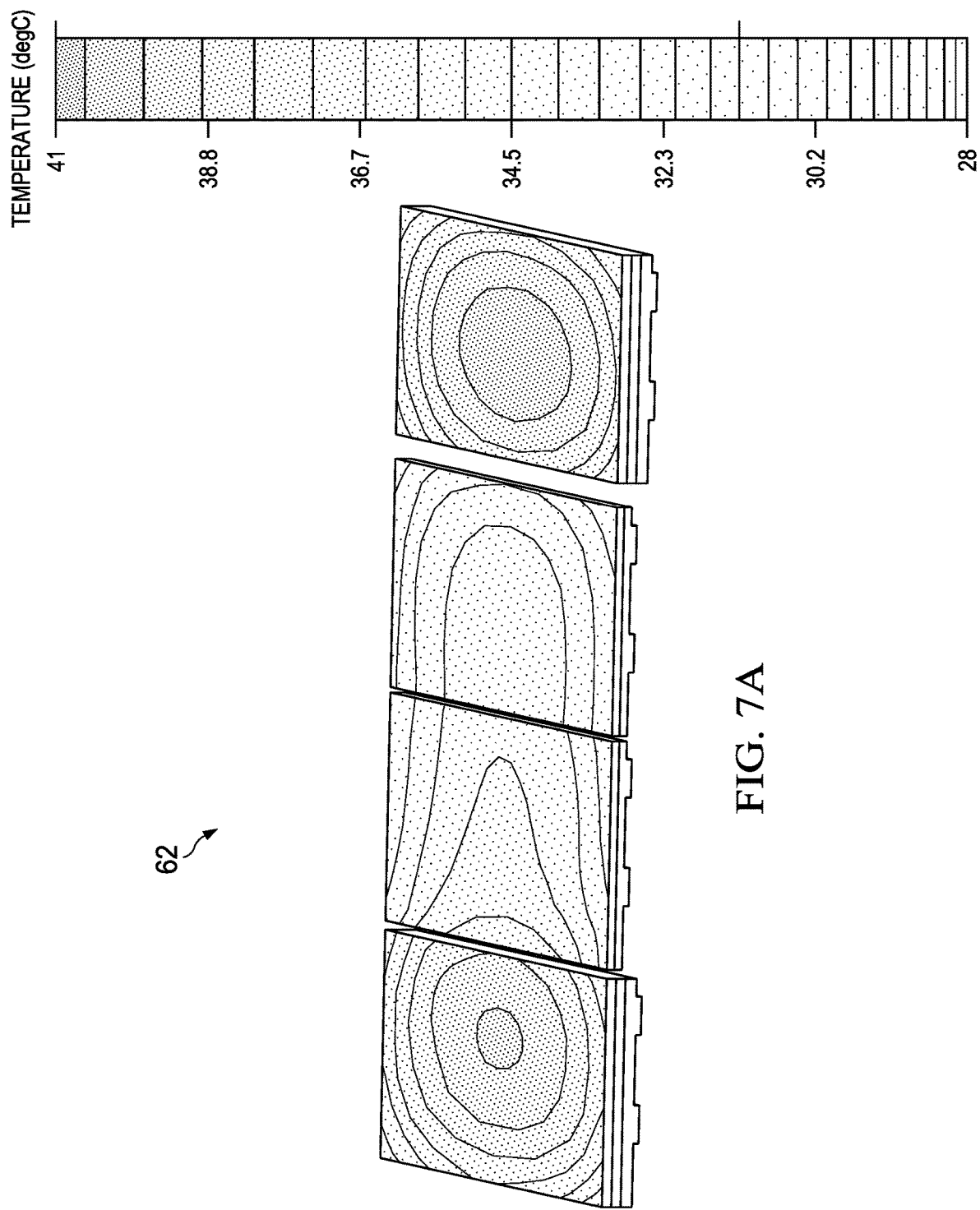
FIGS. 7A, 7B, and 7C depict a thermal simulation of an example of improved thermal dissipation for stacked versus cantilevered battery cells.
Figure 7B:
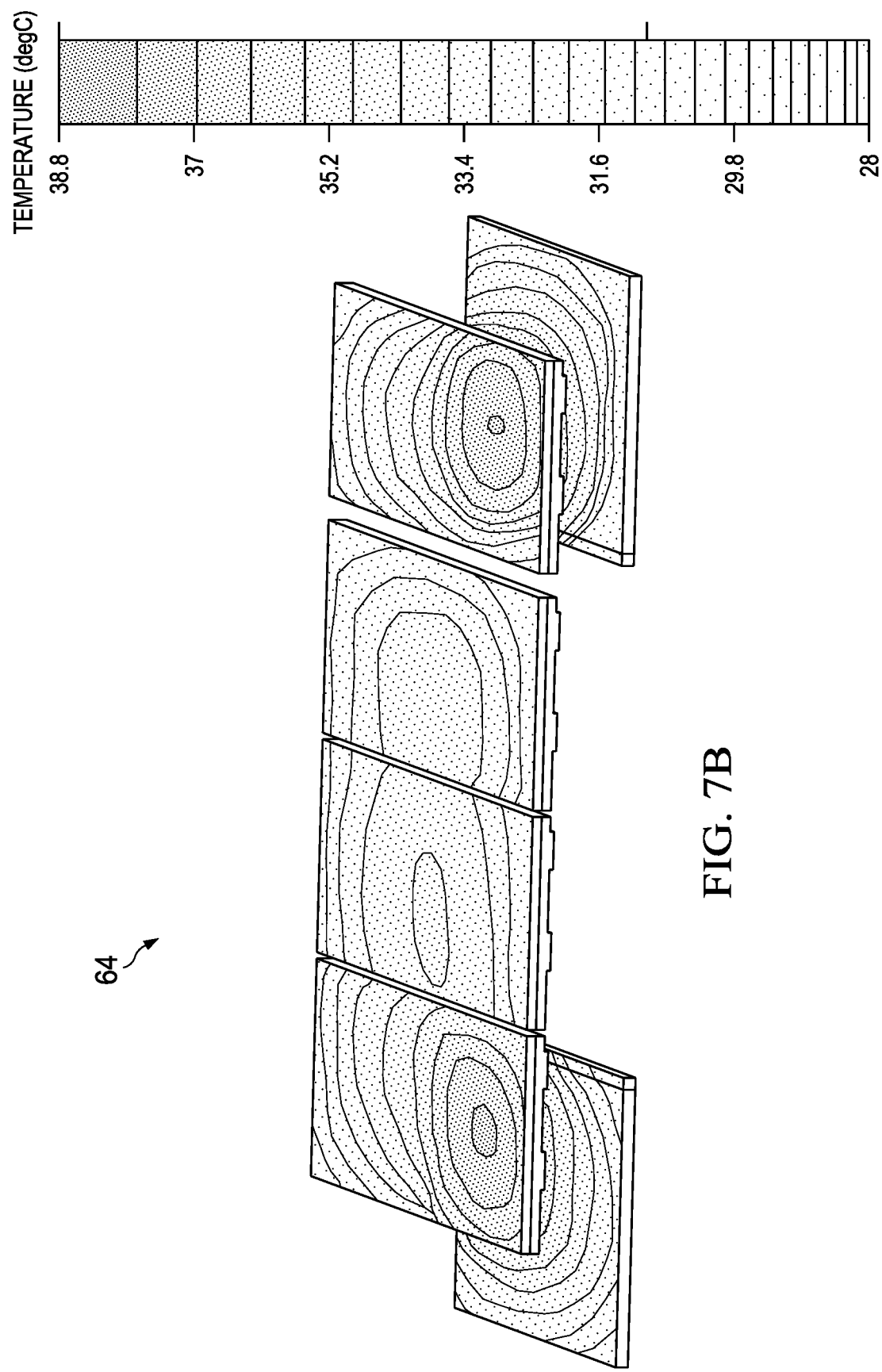
Figure 7C:
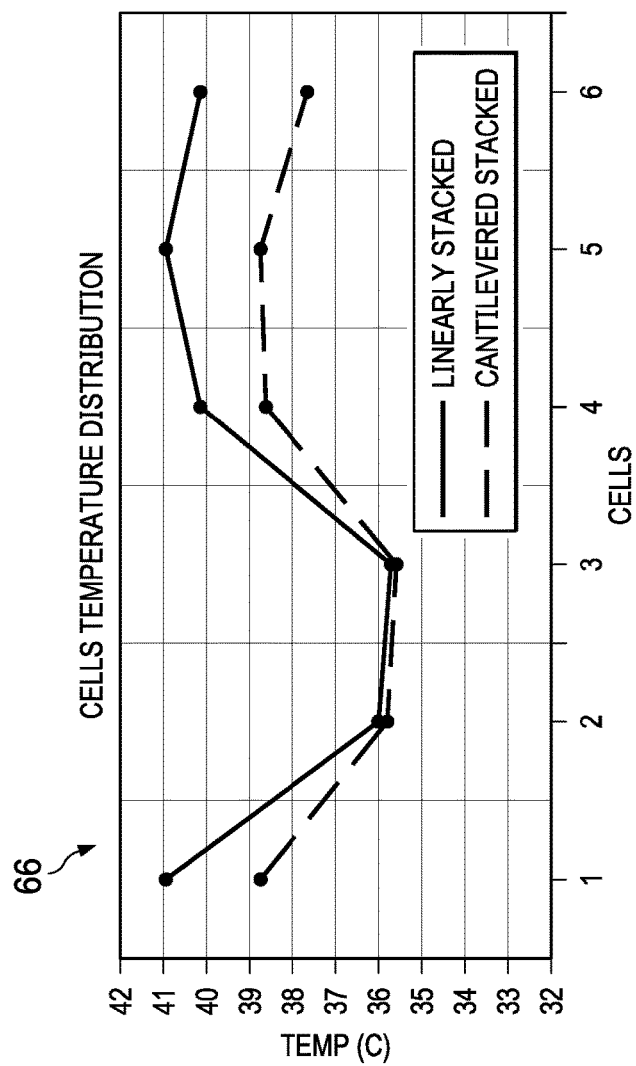

Referring now to FIGS. 7A, 7B, and 7C, a thermal simulation depicts an example of improved thermal dissipation for stacked versus cantilevered battery cells. Thermal simulation 62 depicts temperature distributions in a battery pack having six battery cells with stacked battery cells aligned at the outer sides of the battery pack, such as during a defined power discharge or charge. Thermal simulation 64 depicts temperature distributions in a battery pack having six battery cells with a cantilevered configuration. In simulation 64, the cantilevered battery cells have an orientation perpendicular to that of the row of battery cells with a corner extending outward from the row. Chart 66 shows the battery cell temperature distribution across the battery pack at each battery cell as numbered in simulations 62 and 64. Cantilevered disposition of battery cells decreases cell temperatures under like conditions by approximately between 2.2 and 2.5 degrees Celsius.

Figure 8:
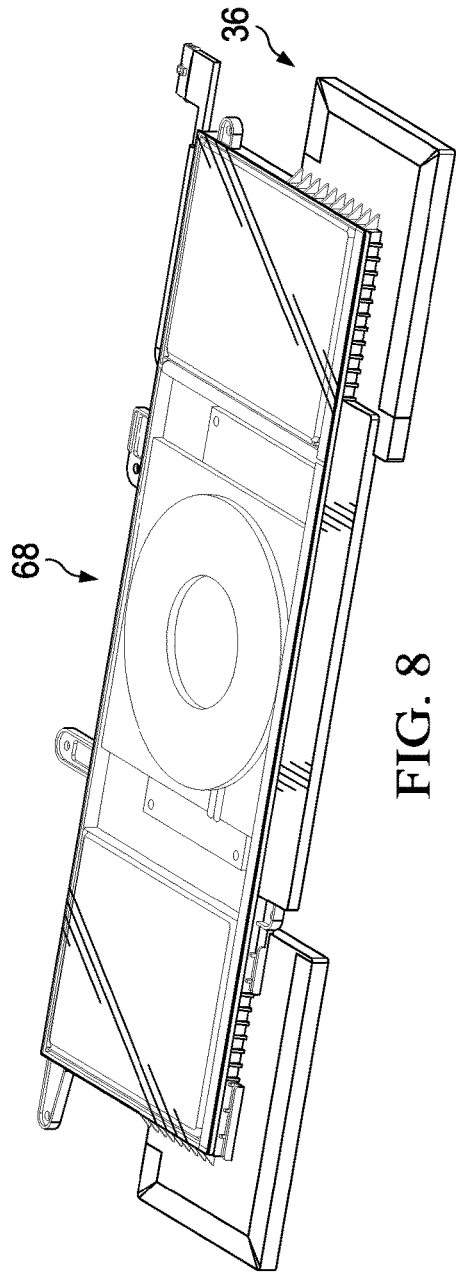
FIG. 8 depicts an upper perspective view of a battery pack having an integrated wireless charger.
Figure 9:
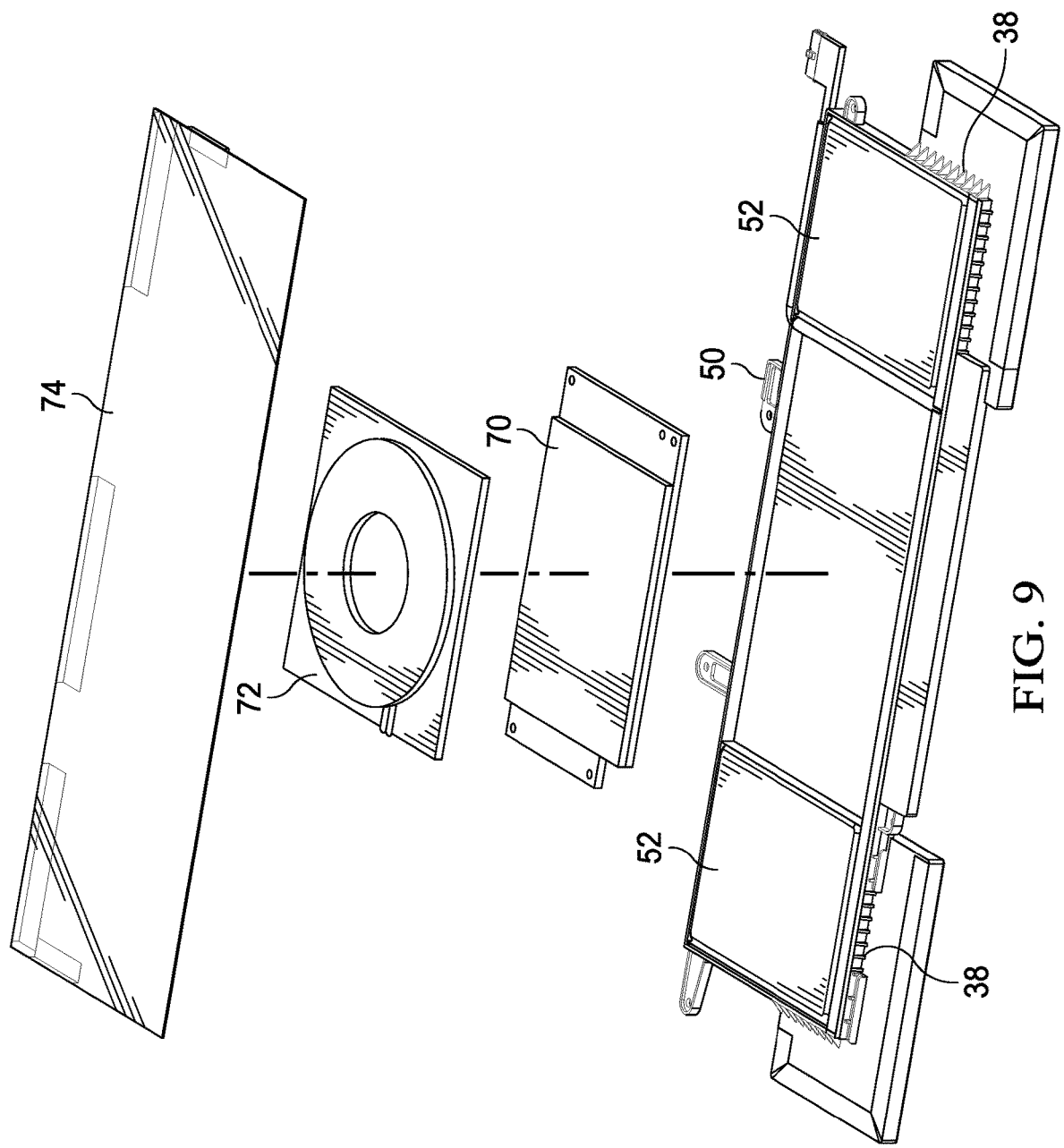
FIG. 9 depicts an exploded view of the battery pack having the integrated wireless charger.

Referring now to FIG. 8, an upper perspective view depicts a battery pack 36 having an integrated wireless charger 68. In the example embodiment, wireless charger 68 fits between battery cells 52 in the upper plane of battery frame 50 to accept battery charger from an external wireless charger. In a typical configuration, wireless charger 68 would assemble at the bottom of an information handling system housing to be in proximity to the wireless charger when resting on the wireless charger. FIG. 9 depicts an exploded view of battery pack 36 to illustrate one example of integration with battery cells 52. In the example embodiment, wireless charger 68 assembles in the place of the center two battery cells 52. A power receiving unit (PRU) 70 couples at the base of battery frame 50 and interfaces with the battery management unit to control presentation of charge to the battery cells. A charging coil 72 couples over and interfaces with PRU 70 to accept inductive charging signals from an external wireless power source and provide the power to PRU 70. The assembly of wireless battery charger 68 is then integrated in battery pack 35 with a protective tape 74 to encapsulate the assembly. Although the example embodiment replaces two battery cells with battery charger 68, in alternative embodiments battery charger 68 may be assembled in the cantilevered plane of battery frame 50 between cantilevered battery cells 38 so that all six battery cells are included in battery pack 36. The example embodiments of battery pack 36 depict six battery cells, however, in alternative embodiments additional battery cells may be included as may additional battery frame cells to hold the battery cells. For instance, a third plane may be included in battery pack 36 having additional cantilevered battery cells with the cells aligned with the opposing cantilevered battery cells or extending from an opposite side of battery pack 36.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a processor disposed in the housing and operable to process information;
   a memory disposed in the housing and interfaced with the processor, the memory operable to store information; and
   a battery disposed in the housing, the battery having plural cells cooperatively interfaced to output a predetermined voltage, the plural cells having a flat rectangular shape, a first set of the plural cells coupled adjacent to each other end to end in a first plane, a second set of the plural cells stacked vertically in a second plane relative to the first plane and cantilevered to extend outward from each end of the first set of the plural cells.

2. The information handling system of claim 1 further comprising:
   a frame disposed between the first and second planes, the frame holding the first set of battery cells adjacent to each other and supporting the second set of battery cells cantilevered to the first set of battery cells; and
   a battery management unit integrated in the frame to coordinate charge and discharge of the battery cells as a battery pack.

3. The information handling system of claim 2 wherein each of the plural battery cells flat rectangular shape has a first set of parallel sides longer than a second set of parallel sides, the first set of plural cells having the first set of parallel sides perpendicular to the second set of plural cells first set of parallel sides.

4. The information handling system of claim 3 wherein:
   the first set of battery cells includes four battery cells disposed in a row adjacent to each other; and
   the second set of battery cells include a first battery cell at one end of the row having a corner cantilevered from the end of the row and second battery cell at an opposing end of the row having a corner cantilevered in a symmetric manner to the first battery cell.

5. The information handling system of claim 4 further comprising a wireless antenna disposed between the first and second battery cells of the second set of battery cells.

6. The information handling system of claim 4 wherein the housing and cantilevered battery cells define an acoustic chamber at each of opposing sides of the battery.

7. The information handling system of claim 4 further comprising a wireless charging device integrated in the battery between the first and second battery cells of the second set of battery cells.

8. The information handling system of claim 1 wherein the housing comprises a single planar piece containing the processor, memory and battery disposed under the display.

9. The information handling system of claim 1 wherein the housing comprises:
   a lid housing portion integrating the display;
   a main housing portion integrating the processor, memory and battery disposed under a keyboard; and
   a hinge rotationally coupling the lid housing portion and main housing portion.

10. A method for assembly of an information handling system, the method comprising:
    disposing processing components in a planar housing, the processing components configured to process information;
    coupling a first set of flat battery cells to a first side of a battery frame in a first plane, the first set of flat battery cells coupled end to end in a single row;
    coupling a second set of flat battery cells to a second side of the battery frame in a second plane, a first flat battery cell of the second set of flat battery cells aligned to extend past the first set of flat battery cells at a first end, a second flat battery cell of the second set of flat battery cells aligned to extend past the first set of flat battery cells at second end opposite the first end; and
    disposing the flat battery cells in the planar housing.

11. The method of claim 10 wherein the first and second flat battery cells of the second set of flat battery cells each couple to the first set of flat battery cells to have first and second sides extend past the first set of flat battery cells in a cantilevered manner.

12. The method of claim 11 further comprising:
    coupling a battery management unit to the battery frame; and
    interfacing the flat battery cells and the battery management unit through the battery frame.

13. The method of claim 12 wherein the first set of flat battery cells are aligned perpendicular to the second set of flat battery cells.

14. The method of claim 11 further comprising:
    integrating speakers in the planar housing; and
    defining an acoustic chamber between ends of the cantilevered flat battery cells and the planar housing to enhance sound output by the speakers.

15. The method of claim 11 further comprising:
    coupling a wireless charger to the frame between the first and second flat battery cells of the second set of flat battery cells; and
    interfacing the wireless charger with the flat battery cells.

16. The method of claim 15 further comprising:
    coupling a keyboard to planar housing in the second plane adjacent the second set of flat battery cells; and
    supporting the keyboard with the first set of flat battery cells.

17. A battery comprising:
    a frame having an upper surface and a lower surface;
    a first set of plural flat battery cells coupled to the frame upper surface in a row;
    a first flat battery cell coupled to the frame lower surface at a first end of the frame, the first flat battery cell having a rectangular shape with first and second perpendicular sides extending past the frame; and
    a second flat battery cell coupled to the frame lower surface at a second end of the frame opposite the first end, the second flat battery cell having a rectangular shape with first and second perpendicular sides extending past the frame.

18. The battery of claim 17 wherein all of the first set of flat battery cells, the first flat battery cell and the second flat battery cell have substantially the same dimensions.

19. The battery of claim 18 wherein the first and second flat battery cells are oriented perpendicular to an orientation of the flat battery cells of the first set of flat battery cells.

20. The battery of claim 19 further comprising a wireless charger coupled to the frame between the first and second flat battery cells.

* * * * *